United States Patent [19]

Kalnitsky et al.

[11] Patent Number: 4,968,641

[45] Date of Patent: Nov. 6, 1990

[54] METHOD FOR FORMATION OF AN ISOLATING OXIDE LAYER

[76] Inventors: Alexander Kalnitsky, 23 Wycliffe Street, Nepean, Ontario, Canada, K2G 5M1; Sing Pin Tay, 54 Stradwick Avenue, Nepean, Ontario, Canada, K2J 2Y5; Joseph P. Ellul, 27 Burnbrook Crescent, Nepean, Ontario, Canada, K2H 9A6; Roger S. Abbott, R.R. #3, Richmond, Ontario, Canada, K0A 2Z0

[21] Appl. No.: 370,319

[22] Filed: Jun. 22, 1989

[51] Int. Cl.$^5$ .................... H01L 21/76; H01L 21/308
[52] U.S. Cl. .......................................... 437/69; 437/70; 437/164; 437/242; 156/643; 156/662
[58] Field of Search ............... 437/69, 70, 242, 63, 437/164; 148/119; 156/643, 662; 427/419.2, 419.7

[56] References Cited

U.S. PATENT DOCUMENTS

| | | |
|---|---|---|
| 3,752,711 | 8/1978 | Kooi et al. |
| 3,765,935 | 10/1973 | Rand et al. ........................ 437/242 |
| 3,970,486 | 7/1976 | Kooi . |
| 4,277,320 | 7/1981 | Beguwala et al. .................. 437/242 |
| 4,293,588 | 10/1981 | Neukomm ........................... 437/242 |
| 4,411,929 | 10/1983 | Sato et al. ......................... 437/242 |
| 4,420,872 | 12/1983 | Solo de Zaldivar ................ 156/628 |
| 4,435,447 | 3/1984 | Ito et al. ........................... 437/242 |
| 4,528,211 | 7/1985 | Bhagat .............................. 437/242 |
| 4,551,910 | 11/1985 | Patterson .......................... 437/242 |
| 4,569,117 | 2/1986 | Bagke et al. ....................... 437/63 |
| 4,682,408 | 7/1987 | Takebayashi ....................... 437/63 |
| 4,707,455 | 11/1987 | Tsang et al. ....................... 437/63 |
| 4,740,483 | 4/1988 | Tobin ............................... 437/242 |

FOREIGN PATENT DOCUMENTS

| | | | |
|---|---|---|---|
| 826343 | 10/1969 | Canada . | |
| 920284 | 1/1978 | Canada . | |
| 0106846 | 6/1983 | Japan ............... | 437/242 |
| 0184833 | 8/1986 | Japan ............... | 437/242 |
| 0293728 | 12/1987 | Japan ............... | 437/242 |

Primary Examiner—David Simmons
Assistant Examiner—Lori-Ann Johnson
Attorney, Agent, or Firm—C. W. Junkin

[57] ABSTRACT

In a method for the formation of an isolating oxide layer on a silicon substrate, an anti-nitridation layer is formed on a silicon substrate at locations where isolating oxide is desired. The anti-nitridation layer has openings therethrough which expose the silicon substrate at locations where isolating oxide is not desired. A thin silicon nitride layer is selectively grown at the locations where isolating oxide is not desired by nitridation of the exposed silicon substrate. Isolating oxide is then selectively grown at the locations where isolating oxide is desired. The thin silicon nitride layer inhibits oxide growth at the locations where isolating oxide is not desired. The method reduces "bird's beak" formation and is particularly applicable to high density IGFET devices.

13 Claims, 3 Drawing Sheets

METHOD FOR FORMATION OF AN ISOLATING OXIDE LAYER

FIELD OF THE INVENTION

This invention relates to methods for the formation of isolating oxide layers in semiconductor devices.

BACKGROUND OF THE INVENTION

A thick isolating oxide layer is conventionally grown into the surface of a silicon substrate between locations where Insulated Gate Field Effect Transistors (IGFETs) are formed to electrically isolate adjacent IGFETs from one another. Generally such isolating oxide layers are formed by a sequence of steps known as the LOCal Oxidation of Silicon (LOCOS) process. U.S. Pat. Nos. 3,752,711 and 3,970,486, and Canadian Patents Nos. 826,343 and 920,284 describe LOCOS processes.

In the most commonly used LOCOS process, a thin oxide buffer layer is grown over the entire surface of a silicon substrate. A thick nitride layer is then deposited over the entire oxide buffer layer. The nitride layer is patterned photolithographically to create openings in the nitride layer where a thick isolating oxide is desired. Channel stop impurities may then be implanted through the openings, and silicon beneath the openings is thermally oxidized to grow a thick oxide into the substrate at the openings. The remaining portions of the nitride and buffer oxide layers are then removed, and IGFETs are formed in and on the exposed substrate surface.

In the above process, the thin buffer oxide layer is provided to relieve stresses which would otherwise be applied to the surface of the silicon substrate if the thick nitride were grown or deposited directly on the silicon surface. The thin buffer oxide layer also provides a convenient etch stop during photolithographic definition of the nitride layer. Unfortunately, the thin buffer oxide layer permits lateral growth of the thick isolating oxide layer under the nitride layer at edges of the openings through the nitride layer. This lateral growth of the isolating oxide layer results in "bird's beak" formations which consume valuable area on the surface of the substrate which could otherwise be used for IGFET devices, thereby limiting the maximum device density. The "bird's beak" formations also aggravate "narrow channel effects" which degrade the performance of the IGFET devices.

SUMMARY OF THE INVENTION

This invention seeks to reduce the problems described above with reference to conventional LOCOS processes. In particular, this invention seeks to provide a method for the formation of an isolating oxide layer in which the formation of "birds' beaks" is reduced.

In the inventive method, an anti-nitridation layer is formed on a silicon substrate at locations where isolating oxide is desired. The anti-nitridation layer has openings therethrough which expose the silicon substrate at locations where isolating oxide is not desired. A thin silicon nitride layer is selectively grown at the locations where isolating oxide is not desired by nitridation of the exposed silicon substrate. Isolating oxide is selectively grown at the locations where isolating oxide is desired. The thin silicon nitride layer inhibits oxide growth at the locations where isolating oxide is not desired.

The thin silicon nitride layer acts as a very effective oxidation mask during the growth of the isolating oxide layer because it is grown directly on the underlying silicon. In fact, there is significantly less lateral growth of the isolating oxide layer under the thin grown silicon nitride layer used in the method according to the invention than there is under the thick deposited silicon nitride layer which is used as an oxidation mask in the most commonly used conventional LOCOS method. The reduced lateral oxide growth is partly due to the elimination of the buffer oxide layer which is commonly used between the silicon nitride layer and the underlying silicon, and partly due to the more intimate contact of the grown silicon nitride with the underlying silicon than would be possible with a deposited silicon nitride.

The buffer oxide layer can be eliminated in the method according to the invention because the grown silicon nitride layer is made thin enough to avoid excessive stress at the surface of the underlying silicon, and because the selective growth of the silicon nitride layer eliminates the silicon nitride patterning step which requires an etch stop in the most commonly used LOCOS method.

Because lateral growth of the isolating oxide layer is inhibited in the method according to the invention, the formation of "bird's beaks" is significantly reduced and higher device densities with reduced "narrow channel effects" can be achieved.

BRIEF DESCRIPTION OF THE DRAWINGS

Embodiments of the invention are described below by way of example only. The description refers to accompanying drawings, in which.

DESCRIPTION OF EMBODIMENTS

Figure 1A:
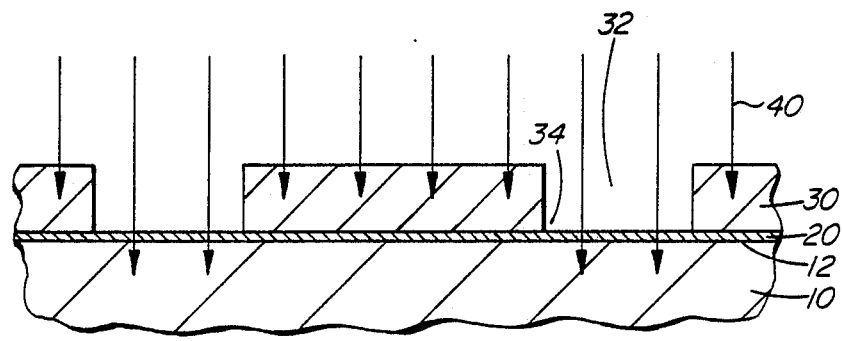
FIGS. 1a–1c are cross-sectional views of a semiconductor device at successive stages of its manufacture by a method which includes a conventional method for the formation of an isolating oxide layer on a silicon substrate.

In the most commonly used LOCOS process for the formation of an isolating oxide layer on a surface of a silicon substrate 10, a thin oxide buffer layer 20 is grown over the entire surface 12 of the substrate 10, and a thick nitride layer 30 is then deposited over the entire oxide buffer layer 20 and patterned photolithographically to create openings 32 in the nitride layer 30 as shown in FIG. 1a. The thin buffer oxide layer 20 relieves stresses which would otherwise be applied to the surface 12 of the substrate 10 if the thick nitride layer 30 were grown or deposited directly on the surface 12. The thin buffer oxide layer 20 also provides a convenient etch stop during photolithographic definition of the thick nitride layer 30.

Channel stop impurities 40 may then be implanted through the openings 32 and thin buffer oxide layer 20 into the substrate 10 as shown in FIG. 1a. The thick nitride layer 30 acts as an implantation mask during implantation of the channel stop impurities 40.

Figure 1B:
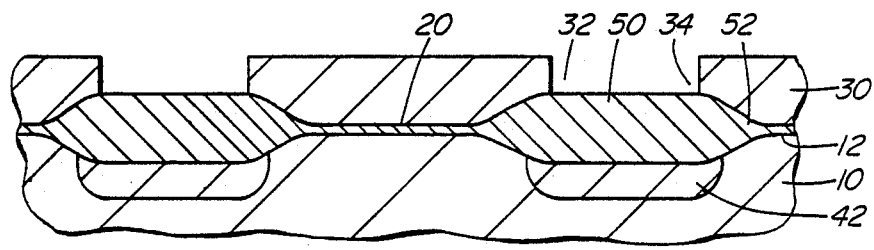

The silicon surface 12 beneath the openings 32 is then thermally oxidized to grow a thick oxide layer 50 into the substrate 10 at the openings 32, as shown in FIG. 1b. The thermal oxidation drives the channel stop impurities further into the substrate 10 to produce channel stop doped wells 42 which are also shown in FIG. 1b.

Figure 1C:
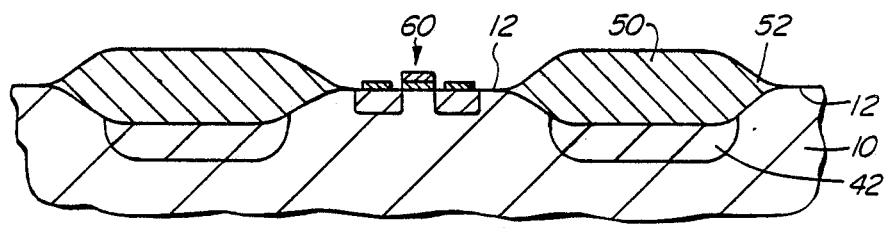

The remaining portions of the thick nitride layer 30 and the thin buffer oxide layer 20 are removed by wet or dry etching, and IGFETs 60 are formed in and on the exposed surface 12 of the substrate 10, in resulting openings 52 in the thick isolating oxide layer 50, as shown in FIG. 1c.

Unfortunately, the thin buffer oxide layer 20 permits lateral growth of the thick oxide isolating layer 50 under the thick nitride layer 30 at edges 34 of the openings 32 through the thick nitride layer 30. This lateral growth results in "bird's beak" formations 52 which consume valuable area on the surface 12 of the substrate 10 which could otherwise be used for IGFET devices, thereby limiting the maximum device density. The "bird's beak" formations 52 also aggravate "narrow channel effects" which degrade the performance of the IGFET devices.

Figure 2A:
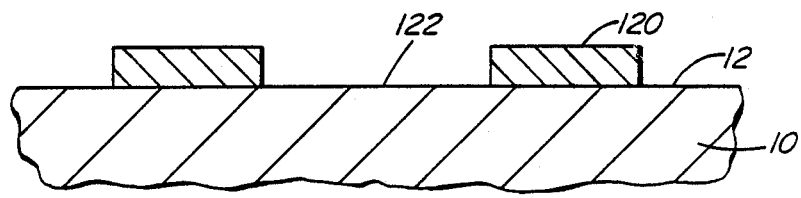
FIGS. 2a–2g are cross-sectional views of a semiconductor device at successive stages of its manufacture by a method which includes a method according to an embodiment of the invention for the formation of an isolating oxide layer on a silicon substrate.

In a method according to an embodiment of the invention for the formation of an isolating oxide layer on a silicon substrate 10, a silicon dioxide anti-nitridation layer 120 is thermally grown over the entire surface 12 of the substrate 10, and preferentially removed at locations where an isolating oxide layer is not desired using conventional photolithographic patterning techniques. In the resulting structure, which is shown in FIG. 2a, the silicon dioxide layer 120 remains at locations where an isolating oxide layer is desired, and has openings 122 therethrough at the locations where the isolating oxide layer is not desired.

Figure 2B:
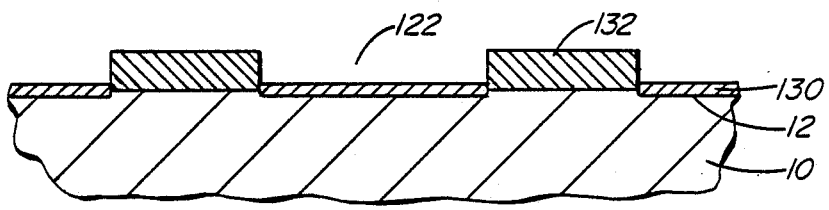

Exposed portions of the surface 12 of the substrate 10 are plasma etched through the openings 122 to remove traces of native oxide at the locations where an isolating oxide layer is not desired. A thin silicon nitride layer 130 (approximately 10 nm thick) is selectively grown at the locations where an isolating oxide layer is not desired by thermal nitridation of the portions of the surface 12 which are exposed by the openings 122. The silicon dioxide layer 120 is converted to an nonhomogeneous oxynitride layer 132 as a byproduct of the thermal nitridation. The resulting structure is shown in FIG. 2b.

Figure 2C:
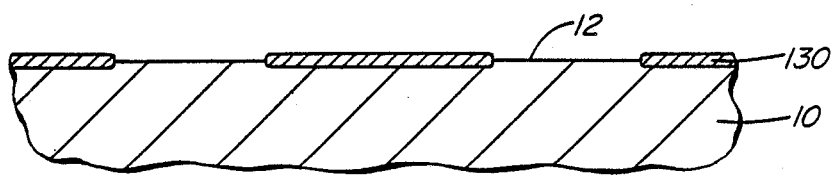
Figure 2D:
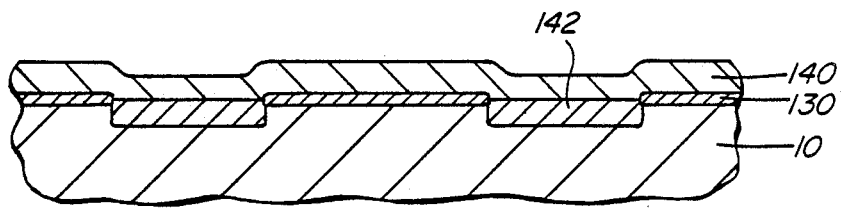

The oxynitride layer 132 is preferentially removed by etching in dilute hydrofluoric acid to expose the surface 12 of the substrate 10 at the locations where an isolating oxide layer is desired, as shown in FIG. 2c.

A doped glass layer 140 is deposited on the exposed surface 12 of the substrate 10 and over the thin nitride layer 130 and patterned to remove the doped glass where no channel stop diffusions are required (for example in n-type device wells of CMOS circuits). The resulting structure is heated to diffuse channel stop impurities from the doped glass layer 140 into the substrate 10 at the locations where channel stop diffusions are desired, thereby forming doped wells 142 The resulting structure is shown in FIG. 2c. The thin silicon nitride layer 130 acts as a diffusion barrier during the diffusion of the doped wells 142.

Figure 2E:
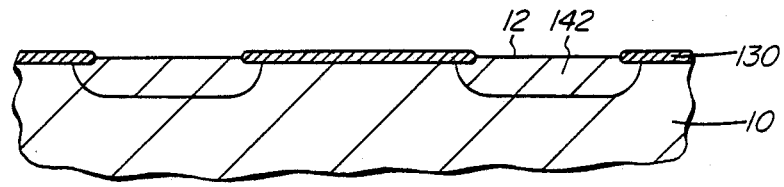
Figure 2F:
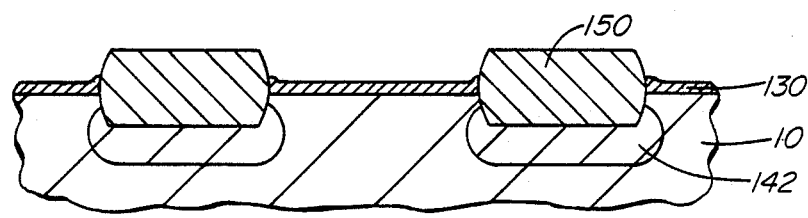

The doped glass is removed by conventional techniques to provide the structure shown in FIG. 2e, in which the surface 12 of the substrate 10 is exposed at the locations where an isolating oxide layer is desired, and covered by the thin nitride layer 130 where no isolating oxide layer is desired. An isolating oxide layer 150 is then grown by oxidation of the exposed surface 12 of the silicon substrate 10 to provide the structure shown in FIG. 2f. The thin nitride layer 130 acts as a very effective oxidation mask during the thermal oxidation. The channel stop impurities are driven further into the substrate 10 during the thermal oxidation to deepen the doped wells 142.

Figure 2G:
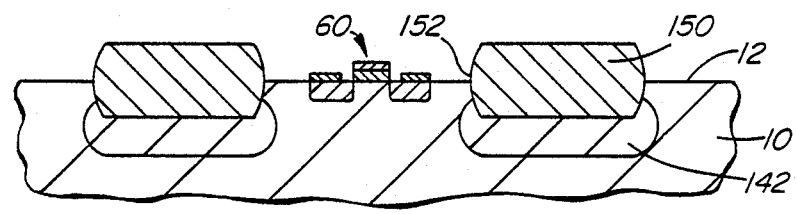

The thin silicon nitride layer 130 is then selectively removed using conventional etching techniques, and IGFET devices are formed in and on the exposed surface 12 of the substrate 10 in resulting openings 152 in the thick isolating oxide layer 150, as shown in FIG. 2g.

The thin silicon nitride layer 130 acts as a very effective oxidation mask during the thermal growth of the isolating oxide layer 150. In fact, there is significantly less lateral growth of the isolating oxide layer 150 under the thermally grown silicon nitride layer 130 than under the thick deposited nitride layer 30 which is used as an oxidation mask in the conventional LOCOS method. Consequently, the formation of "bird's beaks" is significantly reduced in the method according to the embodiment, and higher device densities with reduced "short channel effects" can be achieved.

The silicon nitride layer 130 should be made thin enough to limit the stress applied to the underlying surface 12 of the substrate 10. However, the silicon nitride layer 130 must be made thick enough to act as an effective diffusion mask during the diffusion of channel stop dopants and as an effective oxidation mask during growth of the isolating oxide layer 150. A silicon nitride layer 130 which is approximately 5 nm thick will provide adequate masking against oxidation for growth of an isolating oxide layer 150 which is approximately 3000 Angstrom units thick. A thicker silicon nitride layer 130 will be required for adequate oxidation masking during growth of a thicker isolating oxide layer 150. The silicon nitride layer 130 must be less than approximately 20 nm thick to prevent application of excessive stress to the underlying surface 12 of the substrate 10.

Several modifications of the method described above are within the scope of the invention as claimed below. For example, the selectively grown silicon nitride layer may be thickened by selectively depositing silicon nitride on the grown silicon nitride.

The preferential removal of the oxynitride anti-nitridation layer 132 before oxidation of the underlying silicon substrate is optional in the fabrication of NMOS circuits and other circuits where no channel stop diffusions are required because heating of the oxynitride layer 132 in an oxidizing ambient will induce oxygen to penetrate the oxynitride layer 132 to oxidize the silicon substrate 10 under the oxynitride layer 132. The preferential removal of the anti-nitridation layer before oxidation is required if the anti-nitridation layer is of a material which would prevent oxidation of the underlying silicon, or where the anti-nitridation layer would prevent the desired diffusion of channel stop impurities into the underlying silicon.

The deposition, heating and removal of the doped glass layer 140 are optional and need only be used where channel stop diffusions are required. Thus, these steps may be eliminated if no channel stop diffusions are required as in the fabrication of NMOS circuits. The doped glass layer 140 may be patterned using conventional photolithographic techniques to provide channel stop diffusions only where required if channel stop diffusions are required only at some locations where an isolating oxide layer 150 is to be formed as in CMOS circuits. The thin silicon nitride layer 130 is not thick enough to be an effective implantation mask during conventional implantation of channel stop impurities.

We claim:

1. A method for the formation of an isolating oxide layer on a silicon substrate, comprising:
   forming a silicon dioxide anti-nitridation layer on a silicon substrate at locations where isolating oxide is desired, said anti-nitridation layer having openings therethrough which expose the silicon substrate at locations where isolating oxide is not desired, the silicon substrate being free from buffer oxide;
   selectively growing a thin silicon nitride layer at the locations where isolating oxide is not desired by thermal nitridation of the exposed silicon substrate; and
   selectively growing an isolating oxide layer at the locations where isolating oxide is desired, the thin silicon nitride layer inhibiting oxide growth at the locations where isolating oxide is not desired.

2. A method as defined in claim 1, wherein the step of forming a silicon dioxide anti-nitridation layer comprises:
   forming a silicon dioxide anti-nitridation layer on the silicon substrate; and
   preferentially removing the silicon dioxide anti-nitridation layer at the locations where an isolating oxide is not desired.

3. A method as defined in claim 2, wherein the step of preferentially removing the silicon dioxide anti-nitridation layer comprises photolithographically patterning the silicon dioxide anti-nitridation layer.

4. A method as defined in claim 1, further comprising:
   plasma etching said silicon substrate to remove traces of native oxide at the locations where an isolating oxide is not desired prior to selectively growing said thin silicon nitride layer.

5. A method as defined in claim 2, wherein:
   the step of selectively growing a thin silicon nitride layer comprises converting the silicon dioxide anti-nitridation layer to an oxynitride anti-nitridation layer.

6. A method as defined in claim 1, further comprising thickening the selectively grown silicon nitride layer by selectively depositing silicon nitride on the grown silicon nitride.

7. A method as defined in claim 1, wherein the step of selectively growing an isolating oxide layer comprises inducing oxygen to penetrate the anti-nitridation layer to oxidize the silicon substrate under the anti-nitridation layer.

8. A method as defined in claim 1, further comprising:
   preferentially removing the anti-nitridation layer to expose the silicon substrate at the locations where an isolating oxide is desired after selectively forming the thin silicon nitride layer and before selectively growing an isolating oxide layer; and
   selectively growing the isolating oxide layer by oxidation of the exposed silicon substrate.

9. A method as defined in claim 8, further comprising diffusing channel stop impurities into the exposed silicon substrate at selected locations where an isolating oxide layer is desired after removing the anti-nitridation layer and before selectively growing the isolating oxide layer.

10. A method as defined in claim 9, wherein the step of diffusing channel stop impurities comprises:
    depositing doped glass on the silicon nitride layer and on the exposed silicon substrate;
    removing the doped glass from the silicon substrate where diffusion of channel stop impurities is not desired;
    heating the substrate, the silicon nitride layer and the doped glass to drive impurities from the doped glass into the silicon substrate; and
    removing the doped glass.

11. A method as defined in claim 9, wherein the silicon nitride layer acts as a diffusion barrier during diffusion of channel stop impurities into the exposed silicon substrate.

12. A method as defined in claim 1, further comprising removing the silicon nitride layer after selectively growing the isolating oxide layer.

13. A method as defined in claim 1, wherein the step of growing a thin silicon nitride layer comprises growing a nitride layer to a thickness between 5 nm and 20 nm.

* * * * *